United States Patent [19]
Kondou et al.

[11] Patent Number: 4,947,239
[45] Date of Patent: Aug. 7, 1990

[54] SWING-DRIVEN SOLID-STATE IMAGING DEVICE WITH ELASTIC SUSPENSION MECHANISM FOR IMAGE SENSOR

[75] Inventors: Yuu Kondou; Tomio Ono, both of Yokohama, Japan

[73] Assignee: Kabushiki Kaisha Toshiba, Kawasaki, Japan

[21] Appl. No.: 319,103

[22] Filed: Mar. 6, 1989

[30] Foreign Application Priority Data

Mar. 31, 1988 [JP] Japan .................................. 63-78710

[51] Int. Cl.$^5$ ..................... H01L 23/12; H01L 29/78; H01L 27/14; H04N 3/14
[52] U.S. Cl. ........................................ 357/74; 357/24; 357/30; 358/213.28
[58] Field of Search .............. 357/24, 74, 30 G, 30 H, 357/30 Q, 30 R; 358/213.28

[56] References Cited

U.S. PATENT DOCUMENTS

| | | |
|---|---|---|
| 4,543,601 | 9/1985 | Harada et al. |
| 4,554,586 | 11/1985 | Tanuma et al. |
| 4,581,649 | 4/1986 | Morokawa ..................... 358/213.28 |
| 4,607,287 | 8/1986 | Endo et al. ..................... 358/213.29 |
| 4,608,506 | 8/1986 | Tanuma . |
| 4,634,884 | 1/1987 | Hayashimoto et al. |
| 4,652,928 | 3/1987 | Endo et al. ..................... 358/213.28 |
| 4,748,507 | 5/1988 | Gural ............................. 358/213.17 |

OTHER PUBLICATIONS

SID 82 Digest "Image-Shift Resolution Enhancement Techniques for CCD Images"; Jan. 23.

Primary Examiner—Gene M. Munson
Attorney, Agent, or Firm—Oblon, Spivak, McClelland, Maier & Neustadt

[57] ABSTRACT

A swing-driven solid-state imaging device is disclosed which has a CCD image sensor for receiving incident image light and producing an electrical image signal, a stacking piezoelectric element serving as an actuator for vibrating the image sensor on a plane substantially perpendicular to the image light to thereby cause the image sensor to periodically shift to different sampling positions at different points of time in one frame period in an image sensing mode, and a package structure for receiving the image sensor and piezoelectric element. This package structure includes a base plate and a socket plate, spaced apart from and facing each other, and two arrays of flexible conductive support leads which serve as a suspension mechanism for elastically supporting the socket plate above the base plate and also serve as a part of electrical signal transmission wires for the image sensor and piezoelectric element. The image sensor is adapted to be mounted on the socket plate. The piezoelectric element is coupled to the base plate and socket plate and vibrates the latter plate. Provision of the flexible support leads prevents the weight of the image sensor from being directly applied to the piezoelectric element, thereby ensuring efficient vibration generation by the piezoelectric element.

19 Claims, 4 Drawing Sheets

SWING-DRIVEN SOLID-STATE IMAGING DEVICE WITH ELASTIC SUSPENSION MECHANISM FOR IMAGE SENSOR

BACKGROUND OF THE INVENTION

1. Field of the Invention

The present invention relates generally to a solid-state image sensing device, and, more particularly, to a swing-driven solid-state image sensor that vibrates relative to incoming image light to increase the number of sampling points in one frame image, which contributes to an improvement of the resolution of the image sensor.

2. Description of the Related Art

Increasing the number of pixels is an easy method for obtaining high resolution of a picked-up image in a conventional solid-state image sensor such as an interline transfer type CCD (to be referred to as an "IT-CCD" hereinafter), in accordance with the interlacing image pickup technique. However, even a conventional IT-CCD having a standard number of pixels has the largest chip size among conventional LSIs. When the number of pixels in such a CCD is increased to satisfy the need for higher resolution without increasing the packing density, the chip size thereof becomes larger. In addition, when the number of pixels is increased while keeping the conventional CCD chip size unchanged, the packing density of the pixels must be enhanced greatly (e.g., more than four times greater). It is technically difficult to prepare such a high-density CCD. Even if development of improved fabrication technique allows the manufacture of such a CCD in the near future, there will arise new problems: complication of the circuit configuration for driving such a CCD, undesirable increase in drive frequency and increase in power consumption.

As a solution to the problems, the CCD is periodically displaced relative to incident image light, thereby picking up a high-resolution image. In two field periods constituting one frame period in the NTSC system, when the CCD is swung at an amplitude corresponding to ½ the pixel pitch such that pixels are positioned in different sampling positions along a horizontal direction, the apparent number of spatial sampling points along the horizontal direction can be doubled. Even with the use of a conventional low-resolution IT-CCD chip, therefore, the horizontal resolution of the one-frame image can be substantially doubled.

A solid-state image sensing device for performing the aforementioned swing image pickup should have a mechanism which is held together with the IT-CCD chip in a single package unit to effectively swing the IT-CCD chip in the desired vibration mode. Piezoelectric elements such as bimorph piezoelectric elements are used to minimize the vibration loss of CCD chips having a larger chip size than the conventional LSI chips while generating a maximum effective vibration. It is, however, difficult to pack the piezoelectric elements and their electrical connections together with the CCD chip in a single device. This is because when the common lead wire connection or normal film connector is used to electrically bias the piezoelectric elements subjected to mechanical vibrations, the connection itself undesirably serves to decisively limit the vibration of the piezoelectric elements.

SUMMARY OF THE INVENTION

It is therefore an object of this invention to provide a new and improved swing-driven solid-state imaging device wherein a vibration generating unit for vibrating or swinging an image sensor chip is well packaged with the chip in minimum size and which can improve the reliability of a mechanical support to provide an accurate alignment of the vibrating image sensor chip and flatness of a picked-up image as well as the reliability of electric connection for the support.

In accordance with the above object, this invention is addressed to a specific swing-driven solid-state imaging device, which includes a displacement generating arrangement for positionally shifting the solid-state imaging device relative to incoming image light. This arrangement has a substrate and a plate member which is spaced above from the substrate and on which an imaging device is mounted. An flexible support is provided between the substrate and the plate member, and elastically supports the plate member above the substrate. A swing driver, coupled to the substrate and plate member, receives an externally-supplied electrical drive signal and causes such a periodic displacement as to vibrate the plate member in the desired vibration mode, thereby permitting the solid-state imaging device to periodically shift to different sampling positions at different points of time in one frame period in high-resolution image sensing mode. The swing drive includes an piezoelectric element. The flexible support includes plural arrays of conductive pin-shaped wire leads which support the plate member and permit free vibration thereof; these conductive leads serve at least partially as connection wires for electric-signal transmission for the solid-state imaging device adapted to be mounted on the plate member.

This invention and its objects and advantages will become more apparent from the following detailed description of preferred embodiments.

BRIEF DESCRIPTION OF THE DRAWINGS

In the detailed description given below, reference is made to the accompanying drawings of which.

DETAILED DESCRIPTION OF THE PREFERRED EMBODIMENTS

Figure 1:
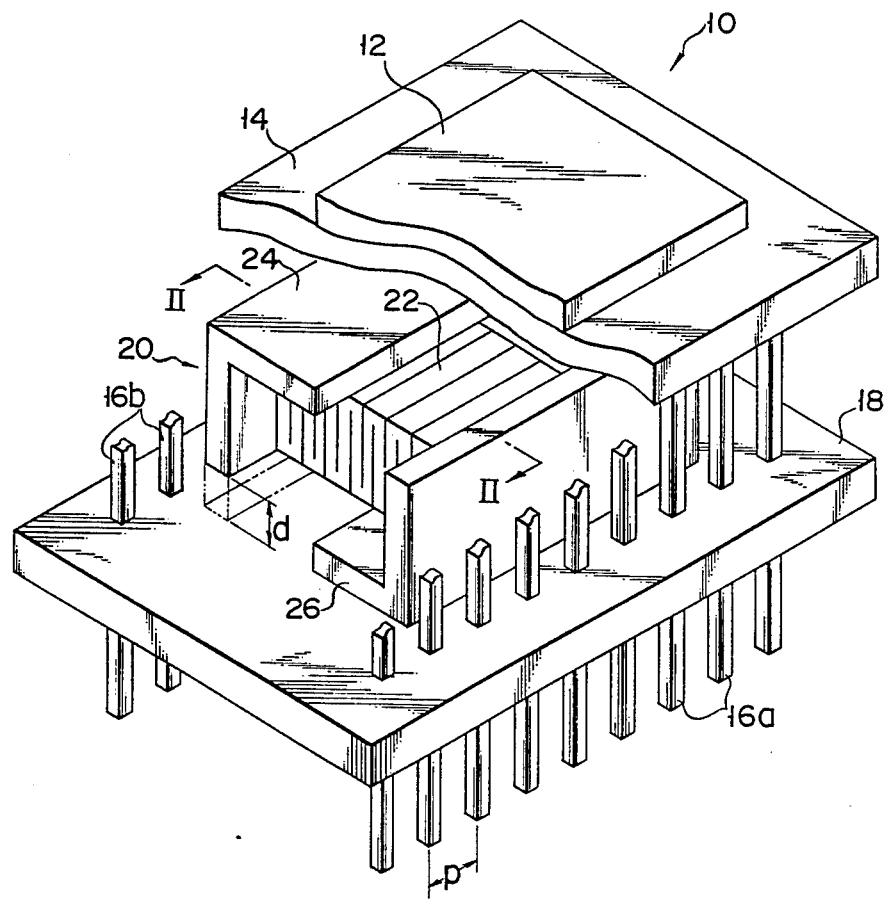
FIG. 1 is a schematic perspective view of a swing-driven solid-state imaging device according to the first embodiment of this invention.

Referring now to FIG. 1, reference numeral 10 denotes a swing-driven solid-state imaging device according to one preferred embodiment of this invention. A ceramic package 12 having a solid-state image sensor contained therein is secured on an insulative socket plate 14 that serves as a first support. The solid-state image sensor may be an interline-transfer type charge-coupled device which will be hereinafter referred to as IT-CCD or IT-CCD image sensor according to the practice in the concerned technical field.

Like dual in-line packages or DIP packages for typical IC's, the socket plate 14 has conductive wire leads 16 arranged in two parallel arrays. (In FIG. 1 there are only nine wire leads shown for the sake of diagrammatic simplicity, but a much greater number of wire leads will be provided on a substrate 18 in practice.) These flexible wire leads 16 have a mechanical strength sufficient to support the weight of the CCD package 12 and socket plate 14 and are made of metal flexible enough to permit the socket plate 14 to freely vibrate above the substrate 18. According to this embodiment, the flexible wire leads 16 are phosphorus bronze square pillars having a 0.64-mm cross section, for example. These wire leads 16 are electrically coupled to signal terminals and power source terminals (not shown) of the CCD package 12.

The flexible wire leads 16 penetrate the insulative substrate 18, which is spaced apart from, and faces, the socket plate 14 and serves as a second support. More specifically, the first array of wire leads 16a are arranged at one of the two long sides of the substrate 18 and penetrate it at constant intervals p. The second array of wire leads 16a are arranged at the other long side of the substrate 18 and penetrate it at constant intervals p. The substrate 18 has through holes (not visible in FIG. 1) in which the flexible wire leads 16 are secured to the substrate 18 by means of soldering or an adhesive. The flexible wire leads 16 have their upper end sections cut so that they have a constant height from the substrate 18. The socket plate 14 is securely mounted on the end sections of the wire leads 16. Since the wire leads 16 are constituted by flexible metal square pillars, the socket plate 14 is elastically supported above the substrate 18 by the wire leads 16 in such a way as to be able to swing in free directions on a plane, if desired. The lower ends of the wire leads 16 serve as external connection terminals which are adapted to be mounted on an external printed wiring board (not shown).

A displacement generating section or CCD vibrating unit (which may also be referred to as "actuator") 20 is provided between the socket plate 14 and substrate 18 to swing the package 12 containing the IT-CCD so that the package 12 vibrates periodically relative to incident light in imaging mode. For instance, if the CCD package 12 is driven to shift to different sampling positions at a constant cycle in different field periods within one frame period in the imaging mode, the horizontal resolution of a picked-up image can be substantially doubled. This can permit imaging of an incident image in a doubled resolution using a CCD image sensor having a limited pixel density.

Figure 2:
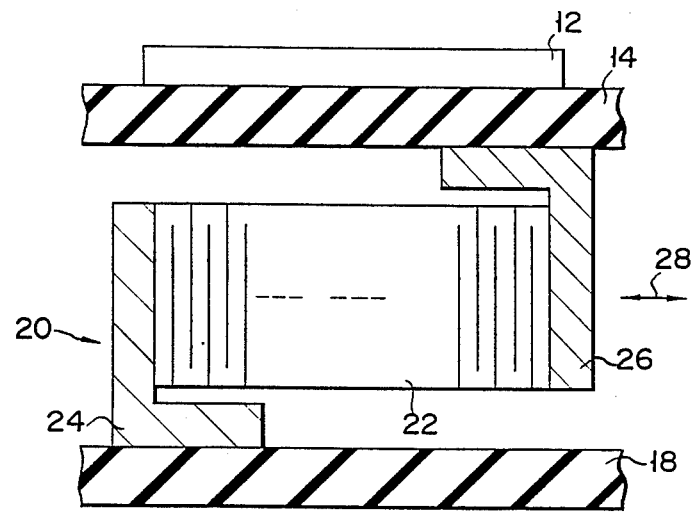
FIG. 2 is a schematic cross-sectional view of the imaging device of FIG. 1 as taken along the line II—II.

As shown in FIG. 2, the CCD vibrator 20 comprises a longitudinal mode stacking piezoelectric element 22 and conductive holders 24 and 26 provided at both end portions of the element 22. These holders 24 and 26 may also be used as electrodes of the piezoelectric element 22, and each have an L-shaped cross section. As shown most clearly in FIG. 2, the L-shaped holder 24 is mounted at its bottom to the socket plate 14 serving as the first support, whereas the other L-shaped holder 26 is mounted at its bottom to the substrate 18 serving as the second support. The former holder 24 defines a distance d between the top of its wall and the back of the socket plate 14, and the latter holder 26 defines the distance d between the top of its wall and the front surface of the substrate 18 (see FIG. 1). The stacking piezoelectric element 22 is sandwiched between the vertical facing walls of the holders 24 and 26. In other words, the piezoelectric element 22 is secured to the vertical walls of the holders 24 and 26.

When an electric swing drive control signal is externally supplied to the piezoelectric element 22, the element 22 contracts in the horizontal direction as indicated by the arrow 28 in FIG. 2, which is normal to the direction of incident image light, and thus causes a periodic displacement in the horizontal direction of the CCD image sensor. This displacement is in synchronization with a change in field periods of the CCD image sensor. Since the displacement or physical vibration of the piezoelectric element 22 causes the first support 14 (socket plate) to reciprocally shift in the direction 28 with respect to the second support 18 (substrate), the CCD package 12 vibrates relative to the incident image light.

According to this embodiment, it is more preferable to design the present device so that the control signal is supplied to the piezoelectric element 22 through any of the flexible wire leads 16 provided between the first and second supports 14 and 16. In this case, the flexible wire leads 16 can serve to transmit signals between the CCD image sensor and the power source as well as to transmit a drive signal to the piezoelectric element 22. This design can, therefore, eliminate the need to separately provide wiring lines for signal transmission.

According to thus constituted device, it is possible to effectively separate the mechanical vibration transmission system for vibrating the package 12 containing the CCD image sensor and the electric signal transmission system (wiring system) for supplying various signals to the package 12. In particular, the piezoelectric element 22 is relieved of the conventional enforced roles to both support the CCD package 12 and vibrate it, and can now exclusively serve to vibrate the package 12. The wire leads 16 are main means for elastically supporting the CCD package 12 and transmitting an electric signal to the package 12. In other words, the flexible wire leads 16 not only serve as means to electrically connect the CCD package 12 and substrate 18, but also as means to physically support the package 12 together with the socket plate 14. Even if the CCD package 12 is enlarged and its weight is increased, therefore, the weight of the package 12 does not act on the piezoelectric element 22 at all, so that the transmission of the physical vibration between the piezoelectric element 22 and the CCD package 12 can efficiently be carried out and the accuracy of controlling the piezoelectric element 22 in vibration mode can be improved. Further, it is possible to minimize the interference of the electric signal transmission system (wiring system) of the present device on the mechanical vibration transmission system, or influence of the wire leads as "an undesired load or resistor" onto mechanical vibration. This can improve the accuracy of the swing driving (vibration controllability) as well as the reliability of the CCD image sensor.

The above arrangement can also improve the mechanical resonance frequency of the swing-driven CCD image sensor since the flexible wire leads 16 are used as parallel leaf springs for elastically coupling the first and second supports 14 and 18, facing each other with a gap therebetween. The flexible mechanical coupling of the supports 14 and 18 by the wire leads 16 can elastically support the vibrating first support 14 (or CCD package 12) effectively while suppressing generation of an undesired vibration to minimum, even when the piezoelectric element 22 vibrates at a high frequency. This helps the CCD package 12 to be swing-driven at a high accuracy and at a high speed in the desired vibration manner, without deviating from the horizontal plane and suffering from generation of a vibration component in the undesired direction. Such highly-accurate and high-speed vibration will be effective in a "multi-field multi-swing driving" by which the CCD package 12 is vibrated in many directions on one horizontal plane.

This embodiment uses no parts which may cause misalignment of the initial mounting position of the CCD package 12: leaf springs for supporting the piezoelectric element 22 on the substrate and a flexible wiring member, such as a film connector for transmitting an electrical signal to the CCD package 12, etc. This naturally improves the accuracy of alignment of the initial mounting position of the CCD package 12 and results in compactness of the present device and simplification of the manufacturing process for the device.

Figure 3:
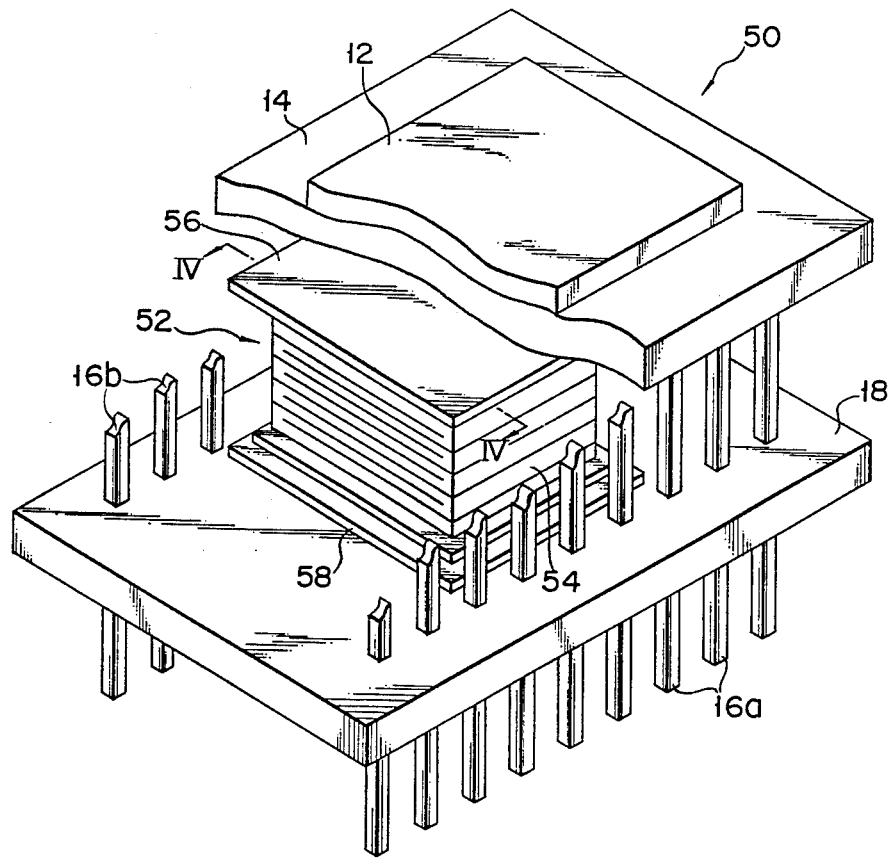
FIG. 3 is a schematic perspective view of a swing-driven solid-state imaging device according to the second embodiment of this invention.

FIG. 3 illustrates a swing-driven solid-state imaging device according to the second embodiment of this invention, which is generally designated by reference numeral "50". The same reference numerals as used for the first embodiment will be used to specify the corresponding or identical components and their detailed description will be omitted below for the sake of descriptive simplicity.

A CCD vibrator 52 provided between the first and second supports 14 and 18 has a slide mode stacking piezoelectric element 54 and upper and lower electrode holders 56 and 58. As illustrated most clearly in FIG. 4, the piezoelectric element 54 has its upper end portion secured to the socket plate 14 (first support) by the holder 56, and has its lower end portion secured to the substrate 18 (second support) by the holder 58.

Figure 4:
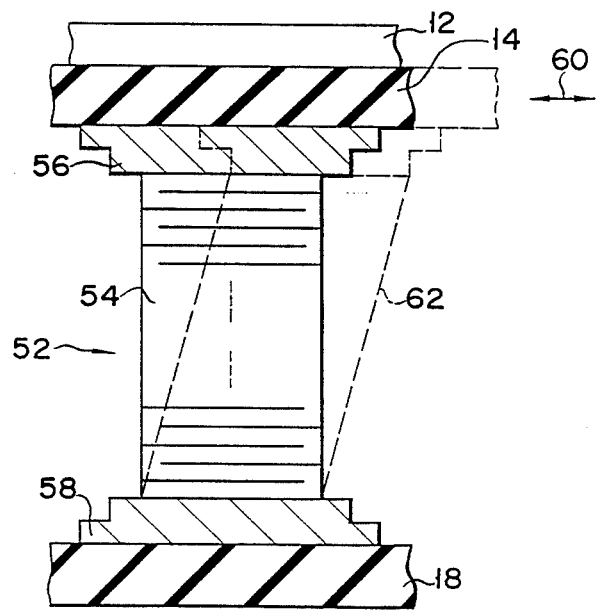
FIG. 4 is a schematic cross-sectional view of the imaging device of FIG. 3 as taken along the line IV—IV.

When a drive signal is externally supplied to the piezoelectric element 54, the element 54 causes a piezoelectric displacement originating from the thickness shear mode. As a result, the socket plate 14 is reciprocally shifted in one direction on a horizontal plane as indicated by reference numeral "60" in FIG. 4. Referring to FIG. 4, the broken line 62 indicates the piezoelectric element 54 at its maximum sliding displacement. The CCD package 12 containing the CCD image sensor vibrates vertically relative to the incident image light to thereby increase the number of substantial sampling points and ensure image sensing with a high resolution as a consequence.

Figure 5:
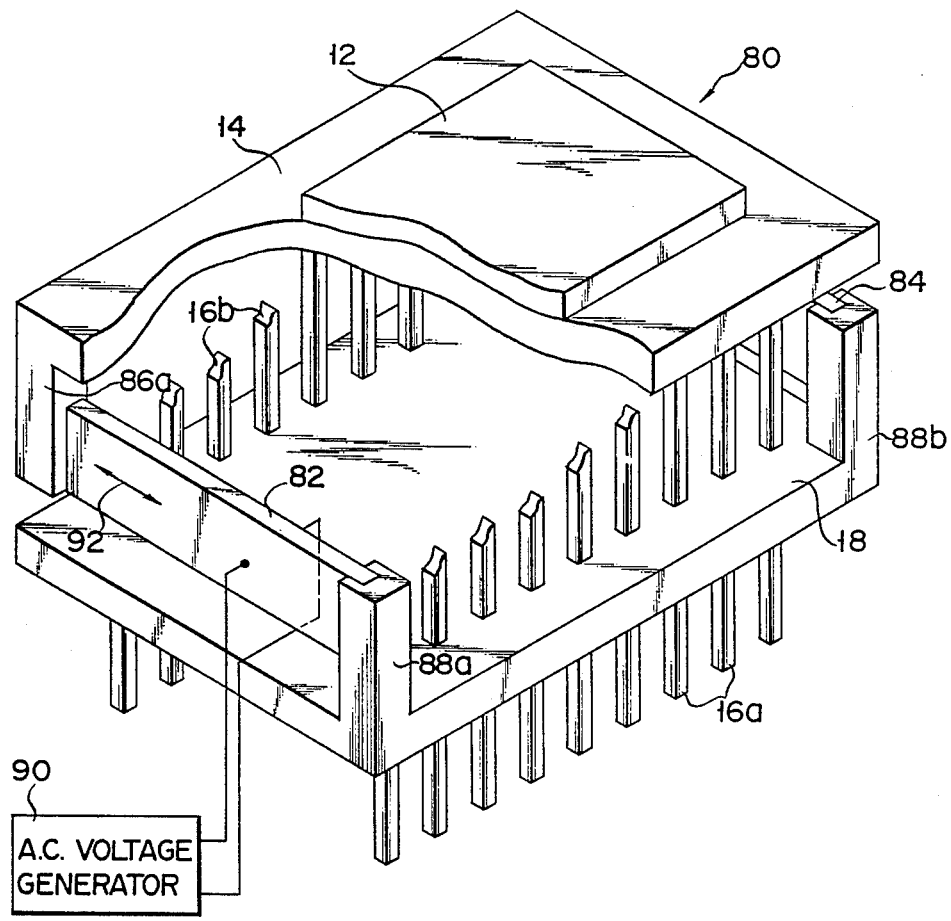
FIG. 5 is a schematic perspective view of a swing-driven solid-state imaging device according to the third embodiment of this invention.

FIG. 5 illustrates a swing-driven solid-state imaging device according to the third embodiment of this invention, which is generally designated by reference numeral "80". The same reference numerals as used for the first and second embodiments will be used to specify the corresponding or identical components and their detailed description will be omitted below for the sake of descriptive simplicity.

As shown in FIG. 5, plate-shaped transverse mode stacking piezoelectric elements 82 and 84 serve as a CCD vibrator (or CCD actuator) for vibrating the CCD package 12 (the element 84 located on the far side being only partially visible for the sake of diagrammatic simplicity). The socket plate 14 has two vertical square pillars 86a and 86b (although the pillar 86b on the far side is not visible for the sake of diagrammatic simplicity). The substrate 18 has two vertical square pillars 88a and 88b on the both corner sections of one long side of the substrate. The vertical square pillars 86a and 88a face each other while the vertical square pillars 86b and 88b face each other. This embodiment is the same as the above-described embodiments in that the socket plate 14 is elastically supported above the substrate 18 by two rows of flexible wire leads 16.

One plate-shaped piezoelectric element 82 is securely fitted at its both end portions in grooves formed in the facing vertical square pillars 86a and 88a. Similarly, the other plate-shaped piezoelectric element 84 is securely fitted at its both end portions in grooves formed in the facing vertical square pillars 86b and 88b. Since each of the piezoelectric elements 82 and 84 is subjected to polarity division along its thickness, when an AC voltage is externally supplied as a vibration control signal to these piezoelectric elements by an AC voltage generator 90, each element 82 or 84 periodically contracts in its lengthwise direction (as indicated by the arrow 92 in FIG. 5). The cyclic contraction or vibrations of the piezoelectric elements 82 and 84 are transmitted through the vertical square pillars 86 and 88 to the socket plate 14 and substrate 18, so that the socket plate 14 vibrates relative to the substrate 18. Consequently, the CCD package 12 is swing-driven with respect to the incident image light to thereby substantially increase the number of sampling points in the image sensing mode and provide high-resolution imaging. With such an arrangement, the structure of the CCD imaging device which can be effectively swing-driven as per those in the first and second embodiments can be further simplified.

Although the invention has been described with reference to specific embodiments, it shall be understood by those skilled in the art that numerous modifications may be made that are within the spirit and scope of the inventive contribution.

For instance, although the wire leads 16 serving to elastically support the socket plate 14 above the substrate 18 are metal pins with a rectangular cross section arranged in two arrays, this invention is not limited to this particular design, and a high-molecular film having the proper thickness and having the proper wiring pattern printed thereon may replace the wire leads. The CCD swing-driven device may be sold, if desired, without the CCD package 12 mounted thereon. In this case, the CCD package 12 may be mounted later by makers of the CCD imaging devices. Mounting the CCD package 12 in the swing-driven device is relatively easy and the above device supplying system will promote production of half-completed devices.

What is claimed is:

1. A displacement generating arrangement for shifting a solid-state imaging device periodically relative to incident image light, said arrangement comprising:
   (a) a substrate;
   (b) plate means provided spacially above said substrate, for mounting thereon said imaging device;
   (c) suspension means, provided between said substrate and said plate means, for elastically supporting said plate means above said substrate; and
   (d) swing-driver means, coupled to said substrate and said plate means, for receiving an externally supplied electric drive signal and for causing cyclic displacement such that said plate means vibrates in a desired vibration mode.

2. The arrangement according to claim 1, wherein said swing-driver means comprises a piezoelectric element.

3. The arrangement according to claim 2, wherein said suspension means comprises plural arrays of conductive pin-shaped wire leads for suspending said plate means to permit free displacement thereof, said wire leads serving as connection wires for electric signal transmission for said solid-state imaging device adapted to be mounted on said plate means.

4. The arrangement according to claim 3, wherein said conductive leads are secured to said substrate in such a way as to penetrate said substrate, and have first end portions on which said plate means are secured and second end portions serving as external connection terminals.

5. The arrangement according to claim 4, wherein said swing-drive means includes as said piezoelectric element a longitudinal mode stacking piezoelectric element having first and second holders mounted on both end portions thereof, said first holder being secured to said plate means and said second holder being secured to said substrate.

6. The arrangement according to claim 1, wherein said swing-drive means includes as said piezoelectric element a thickness shear mode stacking piezoelectric element arranged substantially vertically on said plate means and said substrate and being secured at both ends thereof to said plate means and said substrate.

7. The arrangement according to claim 1, wherein said swing-driver means includes as said piezoelectric element a plurality of plate-shaped transverse mode stacking piezoelectric elements.

8. The arrangement according to claim 7, wherein said substrate has first vertical pillar members formed at two corners of one side thereof, said plate means has second vertical pillar members formed at two corners of that side thereof which is opposite to said one side of said substrate, and each of said transverse mode stacking piezoelectric elements has both end portions secured to said first vertical pillar portions and said second vertical pillar portions, which face one another.

9. A swing-driven solid state imaging device comprising:
(a) solid-state image sensor means for receiving incident image light and producing an electric image signal;
(b) swing-driver means for vibrating said image sensor means on a plane substantially perpendicular to said image light to thereby permit said image sensor means to perform an image sensing operation in such a manner that said image sensor means cyclically shifts to different sampling positions at different points of time in one frame period in said image sensing operation; and
(c) package means for containing said image sensor means and said swing-driver means, said package means comprising,
conductive flexible support means for elastically supporting said image sensor means and also serving as at least a part of electric signal transmission wires for at least one of said image sensor means and said swing-driver means, said flexible support means preventing a weight of said image sensor means to be directly applied to said swing-driver means, thereby ensuring efficient vibration generation of said swing-driver means.

10. The device according to claim 9, wherein said package means comprises:
first and second substrates spaced apart from each other, said image sensor means being mounted on said first substrate, said flexible support means connecting said first and second substrates in such a way that said first substrate is located above said second substrate for free vibration, and said swing-driver means being coupled between said first and second substrates to cause a cyclic displacement for permitting said first and second substrates vibrate relative to each other.

11. The device according to claim 10, wherein said flexible support means comprises:
electric connection leads penetrating said second substrate and fixed thereto, said electric connection leads being made of a flexible metal member having a sufficient mechanical strength to support said image sensor means and said first substrate and having first edges on which said first substrate is adapted to be mounted and second edges serving as external connection terminals.

12. The device according to claim 11, wherein said connection leads are divided in two parallel arrays of leads, which are arranged substantially equal intervals in each array thereof, whereby said second edges of said connection leads define a dual in-line lead arrangement.

13. The device according to claim 12, wherein said swing-driver means includes a piezoelectric element.

14. The device according to claim 12, wherein said swing-driver means includes a stacking piezoelectric element, as said piezoelectric element, mechanically coupled between said first and second substrates.

15. The device according to claim 12, wherein said swing-driver means includes, as said piezoelectric element, two plate-shaped piezoelectric elements mechanically coupled between said first and second substrates and facing each other.

16. A package for vibrating a solid-state imaging device, comprising:
(a) a base plate;
(b) two arrays of flexible conductive wire leads penetrating and secured to said base plate, and having first edges aligned to have a constant height from a front face of said base plate and second edges aligned to have a constant height from a rear face of said base plate;
(c) a support plate adhered on said first edges of said leads, said solid-state imaging device being mounted on said support plate, said leads being made of metal having a sufficient mechanical strength to support said support plate and having sufficient elasticity to permit free vibration of said support plate above said base plate, and said leads also serving as electric wires for said solid-state imaging device; and base plate and said support plate, for receiving an externally supplied electrical drive signal, causing a cyclic displacement to vibrate said support plate relative to said base plate in response to said drive signal to thereby permit said solid-state imaging device to shift to different sampling positions at different points of time in one frame period in an image sensing mode, whereby an electric image signal having a greater number of pixels than a number of physical pixels of said solid-state imaging device is produced.

17. The device according to claim 16, wherein said solid-state imaging device includes a charge transfer imaging device and wherein said support plate includes a socket plate for said charge transfer imaging device.

18. The device according to claim 17, wherein said leads serve also as a part of electric wires of said piezoelectric element means.

19. The device according to claim 18, wherein said second edges of said leads serve as external connection terminals.

* * * * *